(12) United States Patent
Sukegawa

(10) Patent No.: US 6,265,907 B1
(45) Date of Patent: *Jul. 24, 2001

(54) SIGNAL TRANSMISSION CIRCUIT HAVING INTERMEDIATE AMPLIFIER CIRCUIT

(75) Inventor: Shunichi Sukegawa, Oume (JP)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/053,365

(22) Filed: Apr. 1, 1998

Related U.S. Application Data

(63) Continuation of application No. 08/658,766, filed on Jun. 5, 1996, now Pat. No. 5,828,241, which is a continuation of application No. 08/393,525, filed on Feb. 23, 1995, now abandoned, which is a continuation of application No. 07/979,085, filed on Nov. 19, 1992, now abandoned.

(30) Foreign Application Priority Data

Nov. 22, 1991 (JP) .................................................... 3-334121

(51) Int. Cl.[7] ....................................................... H03L 5/22
(52) U.S. Cl. .................................. 327/67; 327/55; 327/57
(58) Field of Search ................................. 327/51, 54, 55, 327/57, 65, 67, 206, 208, 379, 389, 391; 326/21, 23, 24; 365/205, 227

(56) References Cited

U.S. PATENT DOCUMENTS

| | | | |
|---|---|---|---|
| 4,692,642 | * 9/1987 | Fukuzo et al. | 327/57 |
| 4,697,112 | * 9/1987 | Ohtani et al. | 327/57 |
| 4,716,320 | * 12/1987 | McAdams | 327/52 |
| 4,939,691 | * 7/1990 | Mizukami et al. | 365/189.01 |
| 4,943,944 | * 7/1990 | Sakui et al. | 365/189.05 |
| 4,948,993 | * 8/1990 | Chin et al. | 327/51 |
| 4,980,799 | * 12/1990 | Tobita | 361/311 |
| 5,010,523 | * 4/1991 | Yamauchi | 365/205 |
| 5,065,045 | * 11/1991 | Mok | 327/65 |
| 5,068,831 | * 11/1991 | Hoshi et al. | 365/203 |
| 5,130,581 | * 7/1992 | Oh et al. | 327/55 |
| 5,132,930 | * 7/1992 | Furutani et al. | 365/205 |
| 5,184,326 | * 2/1993 | Hoffmann et al. | 365/201 |
| 5,227,697 | * 7/1993 | Sakagami | 365/203 |
| 5,231,318 | * 7/1993 | Reddy | 327/52 |
| 5,241,504 | * 8/1993 | Seevinck | 365/205 |
| 5,243,574 | * 9/1993 | Ikeda | 365/207 |
| 5,274,598 | * 12/1993 | Fujii et al. | 365/205 |
| 5,307,317 | * 4/1994 | Shiraishi et al. | 365/205 |

\* cited by examiner

Primary Examiner—Terry D. Cunningham
(74) Attorney, Agent, or Firm—William B. Kempler; Frederick J. Telecky, Jr.

(57) ABSTRACT

A signal transmission circuit which enables the distance of signal transmission to be increased, while the signal delay and power consumption are reduced. The signal transmission circuit includes a driver circuit, a receiver circuit, an equalizer circuit that flattens the output of the driver circuit, and an intermediate amplifier circuit. The intermediate amplifier circuit is connected to input/output shared terminals in the wiring that connects the driver circuit and the receiver circuit. With the aid of the positive feedback of the intermediate amplifier circuit, a differential signal output from the driver circuit is amplified and then transmitted to the receiver circuit.

13 Claims, 7 Drawing Sheets

US 6,265,907 B1

SIGNAL TRANSMISSION CIRCUIT HAVING INTERMEDIATE AMPLIFIER CIRCUIT

This application is a continuation of application Ser. No. 08/658,766, filed Jun. 5, 1996, now U.S. Pat. No. 5,828,241, which was a Continuation of application Ser. No. 08/393, 525 filed Feb. 23, 1995, now abandoned, which was a Continuation of application Ser. No. 07/979,085 filed Nov. 19, 1992, now abandoned.

This invention concerns a type of signal transmission circuit. More specifically, this invention concerns a type of signal transmission circuit wherein the signal is amplified and transmitted by means of the positive feedback of an intermediate amplifier circuit having input/output shared terminals.

BACKGROUND OF THE INVENTION

Heretofore, TTL logic used to be the main type of general-purpose logic. However, in the recent years, CMOS logic has replaced the TTL logic as the main type.

The types of CMOS logic include standard CMOS logic (with a chip size about 20 mm and a transmission delay time about 80 nsec), high-speed CMOS logic (with the same chip size as above, and a transmission delay time about 15 nsec), new high-speed CMOS logic (with the same chip size and a transmission delay time about 8 nsec), and advanced high-speed CMOS logic (with the same chip size and a transmission delay time about 4 nsec).

In a conventional LSI chip, such as a CMOS circuit providing a signal transmission circuit, inverters may be used as a driver circuit and a receiver circuit.

FIGS. 10–13 show some examples of a conventional signal transmission circuit.

In the circuit shown in FIG. 10, driver circuit 50 using inverter 52 and receiver circuit 51 using inverter 53 are connected to each other by wiring 200, and the signal is transmitted from driver circuit 50 to receiver circuit 51 by wiring 200, so that the so-called rounding of the signal can be reduced.

In the circuits shown in FIGS. 11–13, in the case when the signal transmission time becomes longer as the signal transmission distance is increased so that the time constant RC due to parasitic resistance and capacitance of wiring 200, corresponding to the delay in the signal transmission time, inverter 54 (FIG. 11), inverters 55, 56 (FIG. 12), or inverters 57–59 (FIG. 13) are connected in series between driver circuit 50 and receiver circuit 51 to improve the delay of the signal transmission time. These inverters 54–59 act as an intermediate amplifier circuit, respectively.

FIG. 14 shows a diagram of characteristics illustrating the relationship between the power consumption of the conventional signal transmission circuit and the wiring length shown in FIGS. 10–13.

In this figure, curve OC in the case when no inverter is used as the intermediate amplifier circuit (the graph which shows the characteristics of the signal transmission circuit in FIG. 10) indicates that the power consumption is about 1.05 mW for a wiring length of 20×1000 μm (2 cm) in an LSI chip. In this case, the signal cycle time is 60 nsec, the wiring capacitance is 0.25 FF/1 μm, and there is a wiring resistance of 0.1 Ω/square.

Curve 2C in the case when inverter 54 is used as the intermediate amplifier circuit (the graph illustrating the characteristics of the signal transmission circuit of FIG. 11) indicates that the power consumption is about 1.1 mW for a wiring length of 20×1000 μm. Curve 3C in the case when inverters 55, 56 are used as the intermediate amplifier circuit (the graph illustrating the characteristics of the signal transmission circuit of FIG. 12) indicates that the power consumption is about 1.15 mW for a wiring length of 20×1000 μm. Curve 4C in the case when inverters 57–59 are used as the intermediate amplifier circuit (the graph illustrating the characteristics of the signal transmission circuit of FIG. 13) indicates that the power consumption is about 1.2 mW for a wiring length of 20×1000 μm.

That is, in the conventional signal transmission circuit, when the wiring length is kept constant such as 2 cm, as more inverters 54–59 are connected in series as intermediate amplifiers interposed in the wiring 200 (FIGS. 10–13), the power consumption of the signal transmission circuit increases. When the signal transmission circuit without an inverter used as an intermediate amplifier as shown in FIG. 10 is compared with the signal transmission circuit shown in FIG. 13 with three inverters that are used as intermediate amplifiers, it can be seen that while the power consumption of the signal transmission circuit in FIG. 10 is 1.05 mW, for the signal transmission circuit shown in FIG. 13, the power consumption is increased to 1.2 mW.

FIG. 15 shows the relationship between the wiring length and the delay in signal transmission. FIGS. 10–13 show the simulation results.

In FIG. 15, the ordinate represents the delay, while the abscissa represents the wiring length.

For example, when the wiring length within LSI chip is 20×1000 μm (2 cm), curve OC in the case when no inverter is used as the intermediate amplifier circuit (the graph which shows the characteristics of the signal transmission circuit in FIG. 10) indicates a delay of about 5.5 nsec; curve 2C in the case when inverter 54 is used as the intermediate amplifier circuit (the graph illustrating the characteristics of the signal transmission circuit of FIG. 11) indicates a delay of about 5 nsec; curve 3C in the case when inverters 55, 56 are used as the intermediate amplifier circuit (the graph illustrating the characteristics of the signal transmission circuit of FIG. 12) and curve 4C in the case when inverters 57–59 are used as the intermediate amplifier circuit (the graph illustrating the characteristics of the signal transmission circuit of FIG. 13) indicate a delay of about 4.5 nsec.

That is, in the conventional signal transmission circuit, when the wiring length is kept constant at 2 cm, as more inverters 54–59 are connected in series as intermediate amplifiers interposed in the wiring 200 (FIGS. 10–13), the delay time becomes shorter. When the signal transmission circuit without an inverter used as an intermediate amplifier as shown in FIG. 10 is compared with the signal transmission circuit shown in FIG. 13 with three inverters that are used as intermediate amplifiers, it can be seen that while the delay of the signal transmission circuit in FIG. 10 is about 5.5 nsec, for the signal transmission circuit shown in FIG. 13, the delay is shortened to 4.5 nsec.

As pointed out hereinbefore, in the aforementioned conventional example, when a number of inverters are connected as intermediate amplifiers so as to reduce the delay of the signal transmission, the power consumption is increased. This is a problem of contradiction. In addition, when the number of the inverters used as intermediate amplifiers is small, the power consumption is still high.Besides, when the number of the inverters used as intermediate amplifiers is increased, there is a limitation on the improvement of the delay of the signal transmission.

FIGS. 16 and 17 show specific circuit examples of other conventional signal transmission circuits designed for improving the aforementioned problems of a signal transmission circuit using inverter circuits.

In the signal transmission circuit shown in FIG. 16, driver circuit 60 and receiver circuit 61 are connected by a precharge circuit 62.

Driver circuit 60 comprises CMOS inverters 63, 64, driving p-type MOS transistors 65, 67, and driving n-type MOS transistors 66, 68.

Input terminal IN is connected to the input of inverter 63 and the gate of nMOS transistor 68; the output of inverter 63 is connected to the gate of pMOS transistor 65. The voltage applied on input terminal IN is applied as the gate voltage on the gate of pMOS transistor 65 and the gate of nMOS transistor 68, respectively.

The inverted input terminal N-IN is connected to the input of inverter 64 and the gate of nMOS transistor 66, and the output of inverter 64 is connected to the gate of pMOS transistor 67. The voltage applied on inverted input terminal N-IN is then applied as the gate voltage on the gate of pMOS transistor 67 and the gate of nMOS transistor 66 as the gate voltage.

The drain of nMOS transistor 66 is connected to the drain of pMOS transistor 65 to form a first transistor pair, while the drain of nMOS transistor 68 is connected to the drain of pMOS transistor 67 to form a second transistor pair.

On the other hand, receiver circuit 61 comprises nMOS transistors 71, 72, pMOS transistors 73–76, and CMOS inverters 77 and 78; nMOS transistors 71, 72 and pMOS transistors 73–76 are cross-coupled to each other.

The source of nMOS transistor 72 and the gate of pMOS transistor 74 are connected to the input side of CMOS inverter 77; the source of nMOS transistor 71 and the gate of pMOS transistor 75 are connected to the input side of CMOS inverter 78.

The precharge circuit 62 comprises nMOS transistors 69, 70. The source of nMOS transistor 69 is connected to the drain of nMOS transistor 65 of the driver circuit 60 and the drain of nMOS transistor 71 of the receiver circuit 61; the source of nMOS transistor 70 is connected to the drain of pMOS transistor 67 and the drain of nMOS transistor 72.

The gate of nMOS transistor 69 is connected to the gate and equalizer terminal EQ of nMOS transistor 70; the drain of nMOS transistor 69 is connected to the drain and $V_{DD}/2$ terminal of nMOS transistor 70.

This signal transmission circuit is used in the signal circuit with a large wiring length of several cm, such as the address circuit, etc., in the LSI chip. As $V_{DD}/2$ precharger functions, the signal is sent from the driver circuit 60 to receiver circuit 61 by precharge circuit 62; by means of the nMOS transistors 71, 72 of receiver circuit 61, the differential signal of the circuit threshold voltage $V_Th$ is derived. This differential signal is then converted to the CMOS voltage level by means of CMOS inverters 77, 78.

In this way, improvement can be realized with respect to the signal transmission delay, and the power consumption can be reduced.

FIG. 17 shows the circuit diagram of the intermediate amplifier circuit connected between the driver circuit and receiver circuit of the signal transmission circuit shown in FIG. 16.

In this intermediate amplifier circuit, the aforementioned differential signal is amplified by converting the differential signal to the CMOS signal, followed by reconverting the CMOS signal to the differential signal. The conversion is accomplished by a receiver circuit 79 which converts the differential signal of the input signal to a CMOS signal and a driver circuit 80 which converts the CMOS signal to the differential signal.

Receiver circuit 79 comprises input terminal IN, inverted input terminal N-IN, nMOS transistors 81, 82 for converting the differential signal to the CMOS signal, pMOS transistors 83–86, and CMOS inverters 87, 88 for amplifying the CMOS signal.

The nMOS transistor 81 and nMOS transistor 82 are connected to each other with their gates and drains connected in a crossed form; the pMOS transistor 84 and pMOS transistor 85 are connected to each other with their gates and sources connected in a crossed form.

CMOS inverters 87, 88 are connected to the gates of pMOS transistors 84, 85, respectively.

Driver circuit 80 comprises CMOS inverters 89, 90, pMOS transistors 91, 93 for converting the CMOS signal to the differential signal, nMOS transistors 92, 94, output terminal OUT and inverted output terminal N-OUT.

The outputs of CMOS inverters 89, 90 are connected to the gates of pMOS transistors 91, 93, the inputs of CMOS inverters 89, 90 are connected to the gate of nMOS transistor 94 and the gate of nMOS transistor 92.

However, as shown in FIGS. 10–13, for the conventional signal transmission circuit made of CMOS inverter circuits connected in series, as the chip size is increased, and the parasitic capacitance and parasitic resistance are increased, delay of the signal transmission time and increase in the power consumption cannot be ignored anymore.

As a replacement of the aforementioned signal transmission circuit, the signal transmission circuit shown in FIG. 16 has been proposed. Compared with the CMOS inverter circuit, the performance of this signal transmission circuit is improved, with the speed increased by about 10%, and power consumption decreased by about 30–40%.

However, in the signal transmission circuit shown in FIG. 16, for example, when the signal transmission distance within the LSI chip becomes longer than about 20 mm, it is impossible to make a simple serial connection of several intermediate amplifiers as in the signal transmission circuit shown in FIGS. 10–13. This is a disadvantage.

For the intermediate amplifier circuit for combining the driver circuit and the receiver circuit as shown in FIG. 17, as the differential signal has to be converted to a CMOS signal on the input side, while the CMOS signal has to be converted to a differential signal on the output side, the speed characteristic is naturally poorer than that of the conventional signal transmission circuit made of CMOS inverter circuits (FIGS. 11–13). This is a problem.

The purpose of this invention is to provide a type of signal transmission circuit wherein the signal transmission distance can be increased, and the signals can be transmitted at a high speed and with low power consumption. Another purpose of this invention is to provide a type of signal transmission circuit in which the signal is transmitted while being amplified by the positive feedback of an intermediate amplifier circuit having input/output shared terminals.

SUMMARY OF THE INVENTION

This invention provides a signal transmission circuit having a driver circuit, a receiver circuit, an equalizer circuit for flattening the output of the aforementioned driver circuit, and an intermediate amplifier circuit, the intermediate amplifier circuit being connected to input/output shared terminals in the wiring that connects the driver circuit and receiver circuit. With the aid of the positive feedback of the intermediate amplifier circuit, the signal from the driver circuit is amplified and then transmitted to the receiver circuit.

Before the signal transmission, the equalizer circuit flattens the signal between the driver circuit and the receiver circuit; the driver circuit converts the input level signal to a differential signal, the intermediate amplifier circuit amplifies by positive feedback the differential signal output from the driver circuit and sends the amplified signal to the receiver circuit, and the receiver circuit converts the input differential signal to a level signal.

Figure 1:
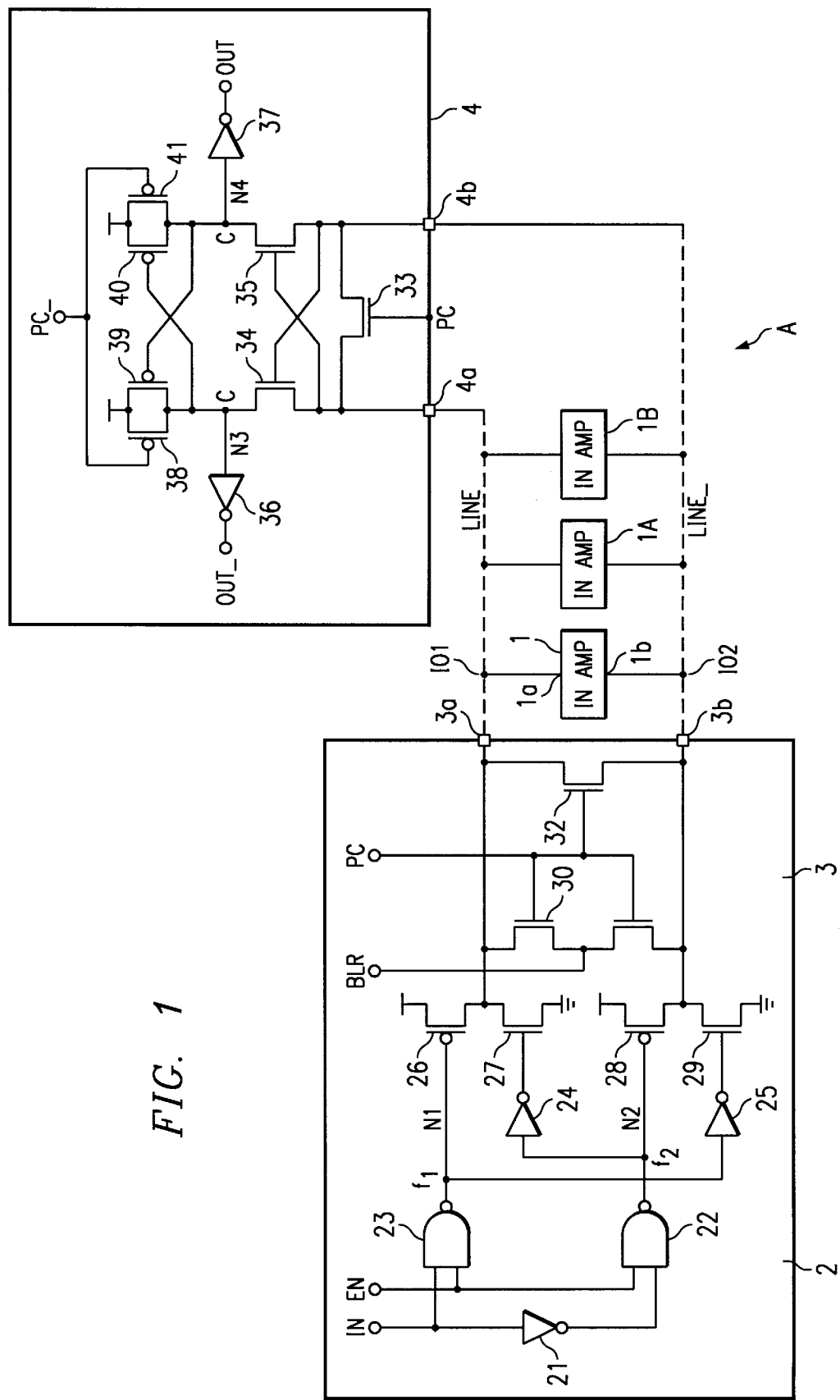
FIG. 1 is a circuit diagram of a signal transmission circuit provided with an intermediate amplifier circuit in an embodiment of the invention.

Reference numerals as employed in the drawings:

1, intermediate amplifier circuit
2, driver circuit
3, equalizer circuit
4, receiver circuit
5, driving transistor
6, driving transistor
7, driving transistor
8, driving transistor
9, precharging transistor
10, precharging transistor
11, precharging transistor
12, precharging transistor
13, precharging transistor
14, precharging transistor
15, precharging transistor
16, precharging transistor
17, transistor
18, transistor
19, transistor
20, transistor
21, CMOS inverter
22, NAND circuit
23, NAND circuit
24, CMOS inverter
25, CMOS inverter
36, CMOS inverter
37, CMOS inverter

DESCRIPTION OF PREFERRED EMBODIMENT

Figure 2:
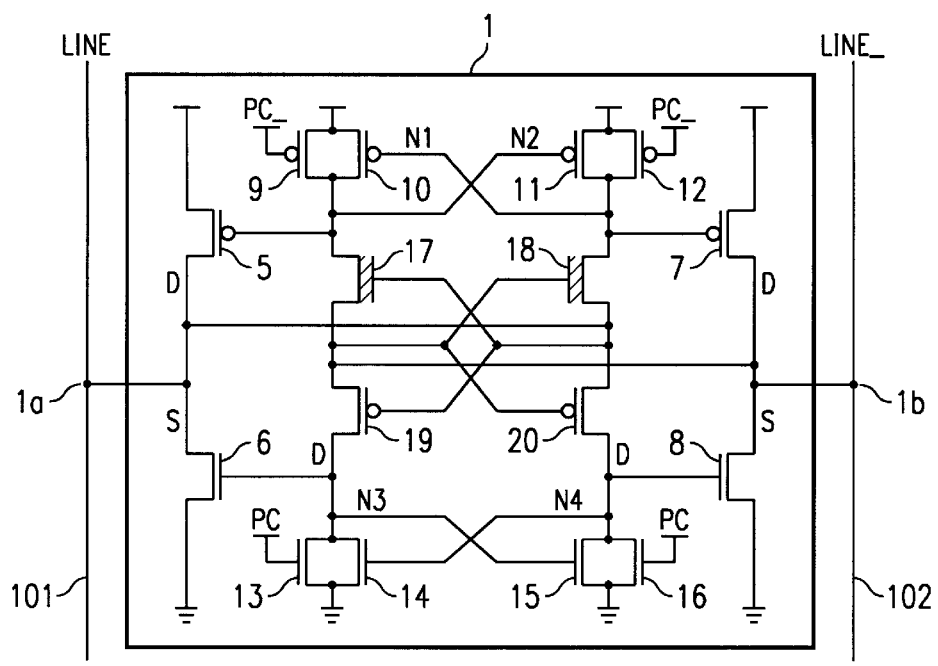
FIG. 2 is a circuit diagram of the intermediate amplifier circuit as the main portion of a signal transmission circuit in an embodiment of the invention.
Figure 3:
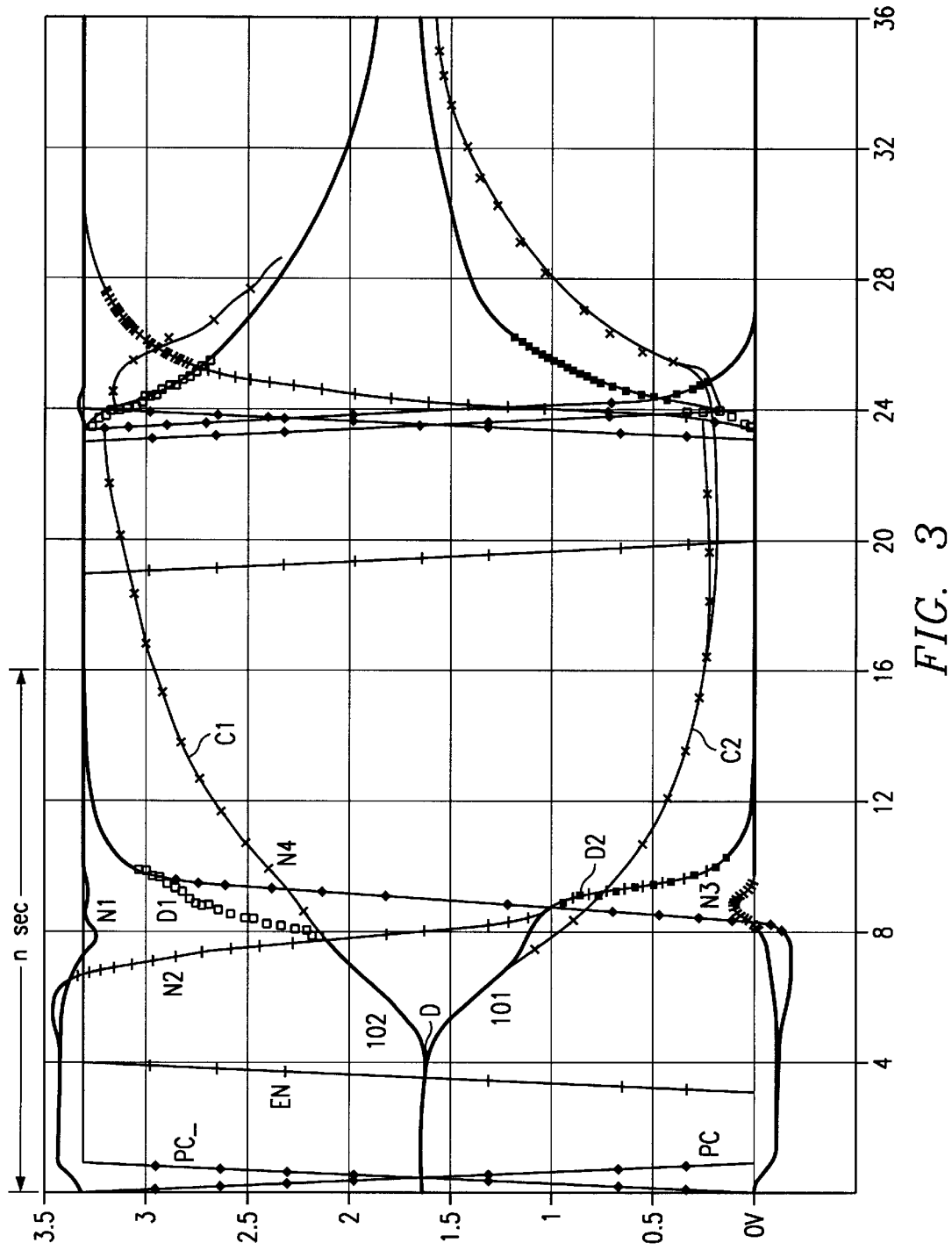
FIG. 3 is a diagram illustrating the signal waveforms at the various nodes of the intermediate amplifier circuit in an embodiment of the invention.

FIG. 1 is a circuit diagram illustrating an embodiment of the signal transmission circuit in accordance with the invention. FIG. 2 is a circuit diagram illustrating an intermediate amplifier circuit as a main portion of the signal transmission circuit in an embodiment of the invention. FIG. 3 shows the waveforms of signals at the various nodes of the intermediate amplifier circuit in an embodiment of the invention. FIGS. 4–7 are circuit diagrams illustrating connection forms of signal transmission circuits in accordance with the invention.

In these figures, A represents the signal transmission circuit used in the case when the signal transmission distance is very long, such as when the wiring length is over 2 cm. This signal transmission circuit A comprises several intermediate amplifier circuits 1, 1A, 1B with the same circuit configuration, a driver circuit 2, an equalizer circuit 3, and a receiver circuit 4.

As shown in FIG. 1, in this intermediate amplifier circuit 1, positive line LINE which connects connecting terminal 3a of equalizer circuit 3 and input terminal 4a of receiver circuit 4 is connected to input/output shared terminal 1a at node 101, and inverted line N-LINE (where N- represents the negative side) which connects output terminal 3b of equalizer circuit 3 and input terminal 4b of receiver circuit 4 is connected to input/output shared terminal 1b at node 102.

There are several intermediate amplifier circuits 1. In the configuration shown in FIG. 1, there are three intermediate amplifier circuits 1, 1A, and 1B connected between equalizer circuit 3 and receiver circuit 4.

FIG. 2 is a circuit diagram illustrating the specific configuration of the first intermediate amplifier circuit 1.

In FIG. 2, intermediate amplifier circuit 1 comprises input/output shared terminals 1a, 1b, driving pMOS transistors 5, 7, and nMOS transistors 6, 8, precharging nMOS transistors 9–12 and nMOS transistors 13–16, as well as switching nMOS transistors 17, 18 and nMOS transistors 19, 20.

Connected to input/output shared terminal 1a are the drain of pMOS transistor 5, the drain of nMOS transistor 6, the source of pMOS transistor 18, and the source of pMOS transistor 20.

Connected to the gate of nMOS transistor 5 are the drains of pMOS transistors 9, 10, the gate of pMOS transistor 11, and the drain of nMOS transistor 17.

Connected to the gate of nMOS transistor 6 are the drain of pMOS transistor 19, the gate of nMOS transistor 15, and the drains of nMOS transistors 13, 14.

In addition, the drains of pMOS transistors 11, 12, the gate of pMOS transistor 10 and the drain of nMOS transistor 18 are connected to the gate of pMOS transistor 7, and the drain of pMOS transistor 20, the gate of nMOS transistor 14, and the drains of nMOS transistors 15, 16 are connected to the gate of nMOS transistor 8.

Besides, the drain of pMOS transistor 7 and the drain of nMOS transistor 8 are connected to output terminal 1b.

When intermediate amplifier circuit 1 is in the initial precharge state, pMOS transistors 5, 7 and nMOS transistors 6, 8 are all in OFF (nonconductive) state.

In this case, the voltage at nodes 101 and 102 becomes the intermediate voltage $V_{DD}/2$; gate node N1 of pMOS transistor 10 and gate node N2 of pMOS transistor 11 become the high level (referred to as "H level" hereinafter); and gate node N3 of nMOS transistor 15 and gate node N4 of nMOS transistor 14 become the low level (referred to as "L level" hereinafter). This is because, in the initial precharge state, the PC terminal becomes the H level, while the N-PC terminal becomes the L level.

When intermediate amplifier circuit 1 is in the driving state, the voltage levels at node 101 and node 102 start drifting from $V_{DD}/2$ the intermediate voltage of power source voltage $V_{DD}$, to the H level and L level, respectively. The characteristics at this point are represented by point D in FIG. 3.

In this case, for the cross-connected transistor pair of nMOS transistor 17 and pMOS transistor 19 and the transistor pair of nMOS transistor 18 and pMOS transistor 20, the effective threshold values become equal to the threshold voltage $V_T$ of the respective transistor.

Consequently, as node 101 enters the H level and node 102 enters the L level, the threshold voltages at node 101 and node 102 are separated from each other by a threshold voltage $1V_T$, and node N2 changes from H level to L level, while node N4 changes from L level to H level.

In this case, pMOS transistor 5 and nMOS transistor 8 become ON (conductive state).

As node 101, which has been on H level, is driven further to an even higher H level, while node 102, which has been on L level, is driven further to L level, a positive feedback takes place for node 101 and node 102, and hence the circuit 1 can operate as an intermediate amplifier circuit.

That is, for intermediate amplifier circuit 1, as shown by the characteristic diagram of FIG. 3 the signal waveform in the signal transmission region is split in two on the intermediate voltage level (point D in FIG. 3). On one hand (point D1 in FIG. 3), there is a steep rise. On the other hand (point D2 in FIG. 3), there is a steep fall. Consequently, a high-speed operation can be realized in the unsaturated region of the transistor. As a result, the amplification operation can be realized with the signal rise (fall) being about 8–10 nsec faster than that suggested by the characteristics of the conventional signal transmission circuit without the intermediate amplifier circuit (curves C1, C2 in FIG. 3).

Consequently, by means of the positive feedback of the intermediate amplifier circuit having input/output shared terminals, the signal can be amplified and transmitted at a high speed and with a low power consumption.

Driver circuit 2 comprises input terminal IN, enable EN terminal, NAND gates 22, 23, CMOS inverters 21, 24, 25, pMOS transistors 26, 28, and nMOS transistors 27, 29.

The input terminal IN of driver circuit 2 is connected through CMOS inverter 21 to one input terminal of NAND gate 22, and the input terminal IN is also connected to one input terminal of NAND gate 23.

Enable EN terminal is connected to the other input terminals of NAND gates 22, 23.

In the driver circuit 2, in the initial precharge state, the enable EN terminal is at L level, while node N1 and node N2 on the output sides of NAND gates 22, 23 are at H level.

On the other hand, equalizer circuit 3 comprises BLR node with the balance signal applied to it, precharge (referred to as PC hereinafter) node and nMOS transistors 30–32.

The BLR node is connected to the drain of nMOS transistor 30 and the drain of nMOS transistor 31, and the BLR node becomes the power source voltage $V_{DD}/2$ in the initial precharge state.

The PC node is connected to the gates of nMOS transistors 30, 31, and 32. In the initial precharge state, the PC node enters the H level; in the drive state, the PC node changes from H level to L level; in the precharge state, it changes from L level to H level.

The drain of pMOS transistor 26 of driver circuit 2 is connected to the sources of nMOS transistors 30, 32 of equalizer circuit 3; the drain of pMOS transistor 28 of driver circuit 2 is connected to the source of nMOS transistor 31 and the drain of nMOS transistor 32 of equalizer circuit 3.

The equalizer circuit 3 can flatten the output of the driver circuit 2.

On the other hand, receiver circuit 4 comprises output terminal OUT, inverted output terminal N-OUT, PC terminal with the precharge signal applied to it, inverted PC terminal N-PC, nMOS transistors 33–35, CMOS inverters 36, 37, pMOS transistors 38–40, and pMOS transistor 41.

In the receiver circuit 4, node 101 of the positive line is connected to terminal 4a, while node 102 of the inverted line is connected to terminal 4b.

Terminal 4a of the receiver circuit 4 is connected to the source of nMOS transistor 33, the drain of nMOS transistor 34, and the gate of nMOS transistor 35.

On the other hand, terminal 4b of receiver circuit 4 is connected to the drain of nMOS transistor 33, the gate of nMOS transistor 34, and the drain of nMOS transistor 35.

The source of nMOS transistor 34 is connected to the input of CMOS inverter 36, the drains of pMOS transistors 38, 39, and the gate of pMOS transistor 40. The source of nMOS transistor 35 is connected to the input of CMOS inverter 37, the gate of pMOS transistor 39, and the drains of pMOS transistors 40, 41.

The output side of CMOS inverter 36 is connected to inverted output terminal N-OUT, while the output side of CMOS inverter 37 is connected to output terminal OUT.

The PC terminal is connected to the gate of nMOS transistor 33, while inverted PC terminal N-PC is connected to the gates of pMOS transistors 38, 41.

For this receiver circuit 4, in the initial precharge state, node N3 and node N4 enter the H level, PC terminal enters the H level, inverted PC terminal N-PC enters the L level, and output terminals OUT and N-OUT become L level.

Then, in the drive state, the PC terminal changes from H level to L level, inverted PC terminal N-PC changes from L level to H level, and the precharge state of signal transmission circuit A is released.

As a result, node 101, node 102, node N3 and node N4 enter the floating state.

In this case, as enable terminal EN changes from L level to H level, and input terminal IN enters the H level, node N1 enters the L level, while node N2 remains on the H level; hence, node 101 of LINE is driven from intermediate voltage $V_{DD}/2$ to H level, and node 102 of the inverted LINE is driven from intermediate voltage $V_{DD}/2$ to the L level, and thus the signal is transmitted to receiver circuit 4.

Consequently, at the receiver circuit 4, node N4 enters the L level, while output terminal OUT enters the H level, and the signal transmission is completed.

FIGS. 4–7 are schematic diagrams illustrating the connecting state of the signal transmission circuit of this invention.

Figure 4:
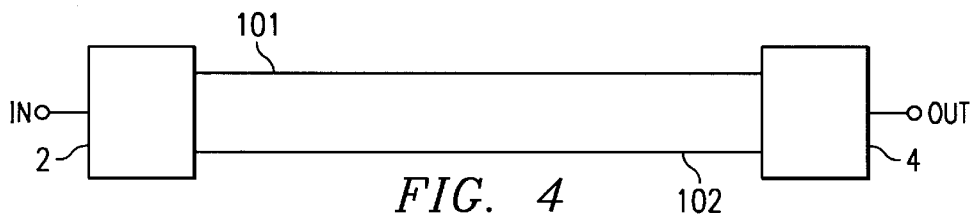
FIG. 4 is a circuit diagram illustrating the connecting state of the signal transmission circuit in an embodiment of the invention.

In the circuit configuration shown in FIG. 4, between driver circuit 2 connected to input terminal IN and receiver circuit 4 connected to output terminal OUT, intermediate amplifier circuit 1 is not connected between node 101 of positive line and node 102 of inverted line N-LINE. Although this configuration is not related to an embodiment of the invention, it is presented for convenience of explanation.

Figure 5:
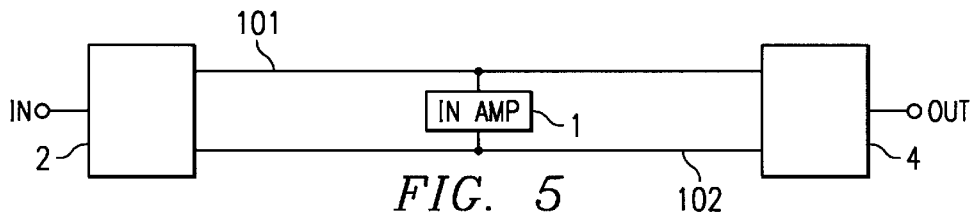
FIG. 5 is a circuit diagram illustrating the connecting state of the signal transmission circuit in an embodiment of the invention.

In the circuit configuration shown in FIG. 5, between driver circuit 2 and receiver circuit 4, one stage of an intermediate amplifier circuit 1 is connected between node 101 of positive line and node 102 of inverted line.

Figure 6:
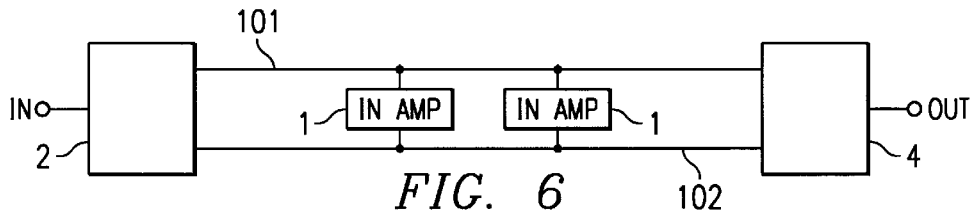
FIG. 6 is a circuit diagram illustrating the connecting state of the signal transmission circuit in an embodiment of the invention.

In the circuit configuration shown in FIG. 6, between driver circuit 2 and receiver circuit 4, two stages of the intermediate amplifier circuit 1 are connected between node 101 of positive line and node 102 of inverted line, and the delay of the signal transmission is improved.

Figure 7:
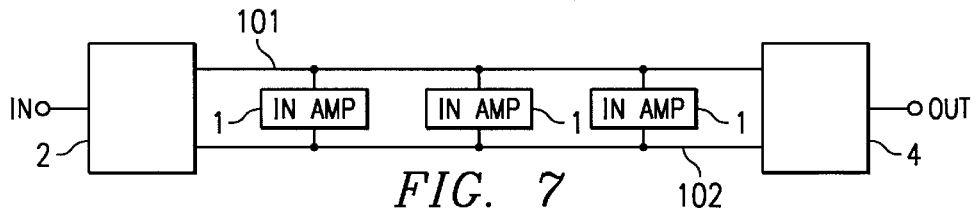
FIG. 7 is a circuit diagram illustrating the connecting state of the signal transmission circuit in an embodiment of the invention.

In the circuit configuration shown in FIG. 7, between driver circuit 2 and receiver circuit 4, three stages of the intermediate amplifier circuit 1 are connected between node 101 of positive line and node 102 of inverted line, and the delay of the signal transmission is further improved.

Figure 8:
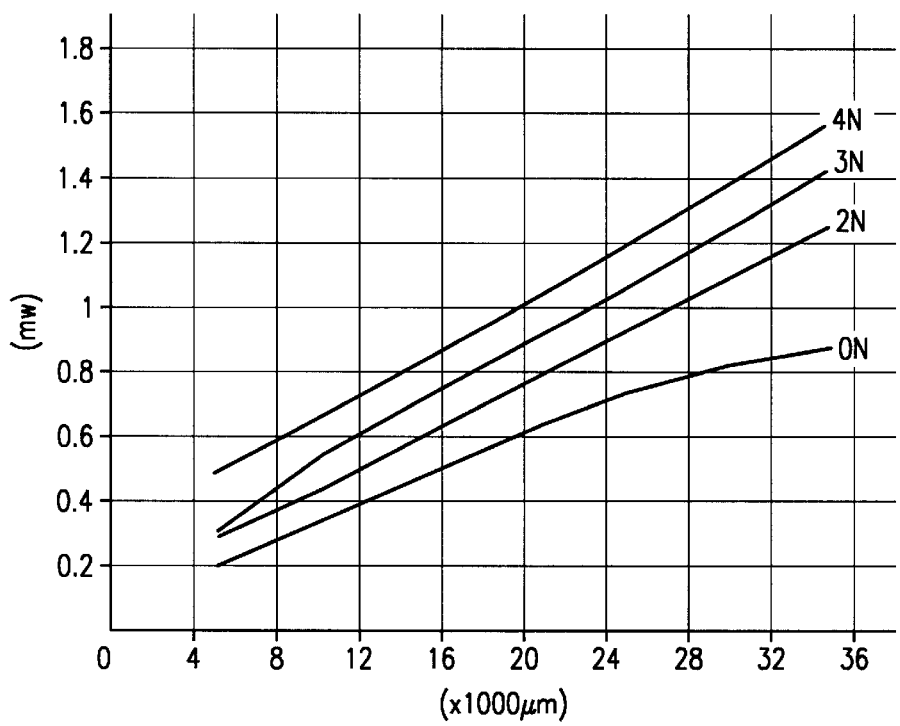
FIG. 8 is a graph showing the relation between the wiring length and the power consumption of the signal transmission circuit for the simulation circuit configurations of FIGS. 4–7.

FIG. 8 is a graph illustrating the relation between the wiring length and the power consumption of the signal transmission circuit for the simulation circuit configurations of FIGS. 4–7.

In FIG. 8, the ordinate represents the power consumption (mW), and the abscissa represents the wiring length (×1000 μm).

In FIG. 8, curve ON shows the relation between the wiring length and the power consumption of the signal transmission circuit for the circuit configuration of FIG. 4 with no intermediate amplifier circuit.

Curve 2N shows the relation between the wiring length and the power consumption of the signal transmission circuit for the circuit configuration of FIG. 5 with one stage of the intermediate amplifier circuit set in place. Curve 3N shows the relation between the wiring length and the power consumption of the signal transmission circuit for the circuit configuration of FIG. 6 with two stages of the intermediate amplifier circuit set in place. Curve 4N shows the relation between the wiring length and the power consumption of the signal transmission circuit for the circuit configuration of FIG. 7 with three stages of the intermediate amplifier circuit set in place.

Figure 14:
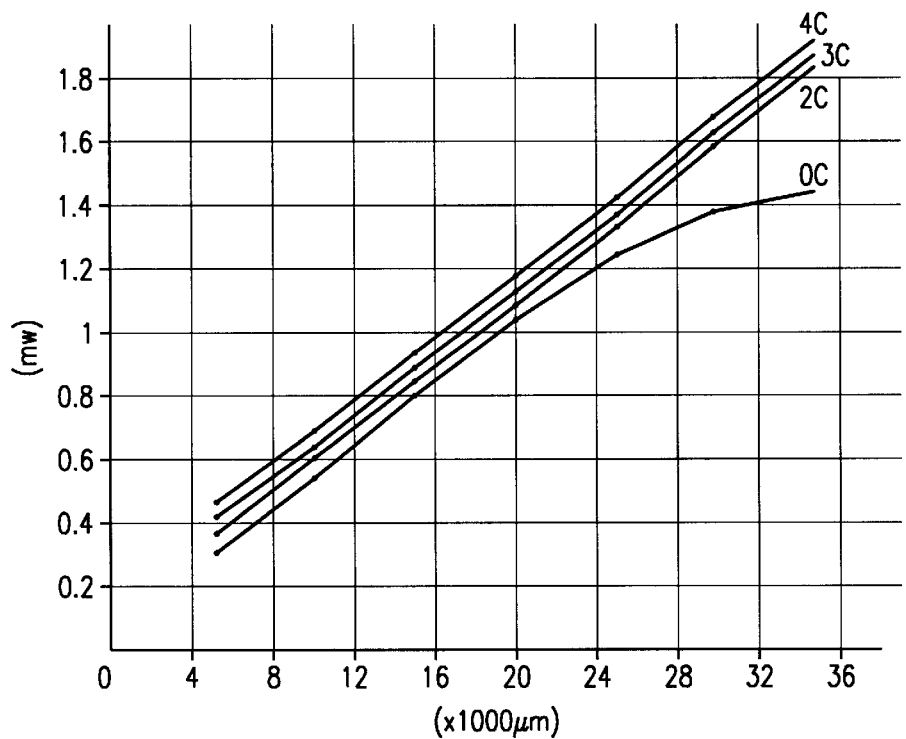
FIG. 14 is a graph showing the relationship between the wiring length and power consumption of the signal transmission circuit corresponding to the inverter connection configurations of FIGS. 10–13 using the conventional CMOS inverters.

As the results shown in FIG. 8 are compared with the results shown in FIG. 14, which show the relationship between power consumption (mW) and wiring length (×1000 μm) in the signal transmission circuit with the conventional CMOS inverters connected in series in the circuit configurations of FIGS. 10–13, it can be seen that when the wiring length is 20 (×1000 μm), for curve 2N with one stage of the intermediate amplifier circuit 1 set in place as shown in FIG. 8, the power consumption is about 0.75 mW (as compared with 1.1 mW for the conventional curve 2C as shown in FIG. 14), that is, there is a reduction of about 0.35 mW in the power consumption.

For curve 3N for the configuration with two stages of the intermediate amplifier circuit 1 connected in place, the power consumption is about 0.9 mW (as compared with 1.15 mW for the conventional curve 3C as shown in FIG. 14), that is, there is a reduction of about 0.25 mW in the power consumption.

For curve 4N for the configuration with three stages of the intermediate amplifier circuit 1 connected in place, the power consumption is about 0.9 mW (as compared with 1.2 mW for the conventional curve 4C as shown in FIG. 14), that is, there is a reduction of about 0.3 mW in the power consumption.

Consequently, compared with the signal transmission circuit using conventional CMOS inverters connected in series, the signal transmission circuit of the invention can reduce the power consumption by about 0.25–0.3 mW.

Figure 9:
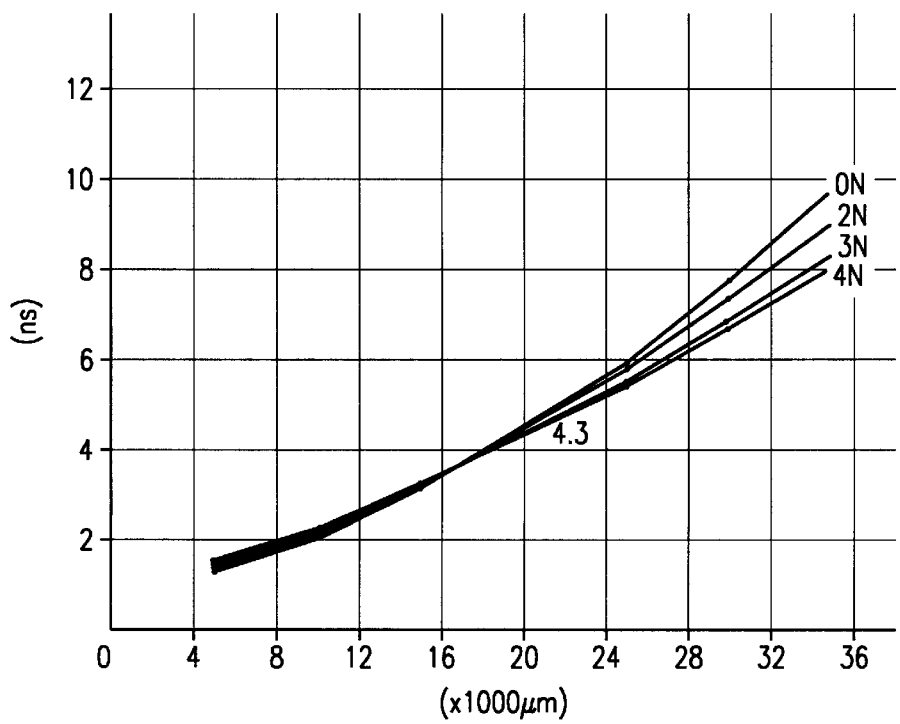
FIG. 9 is a graph showing the relation between the wiring length and the delay of the signal transmission circuit for the simulation circuit configurations of FIGS. 4–7.
Figure 10:
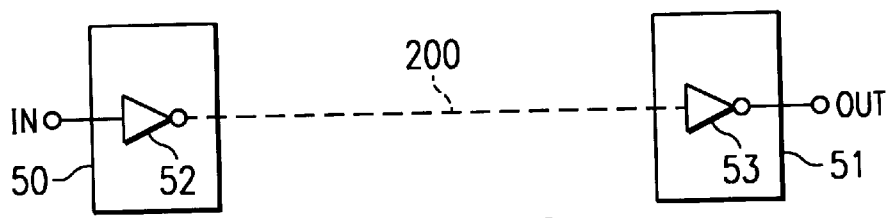
FIG. 10 is a circuit diagram illustrating an example of the signal transmission circuit using conventional CMOS inverters.
Figure 11:
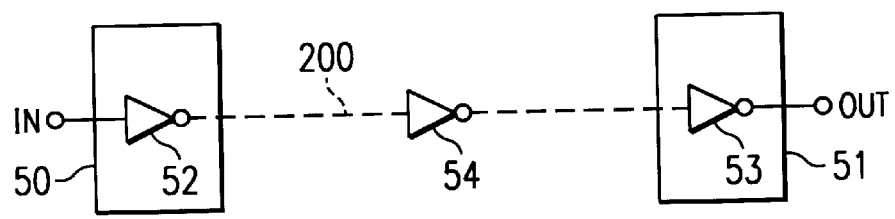
FIG. 11 is a circuit diagram illustrating an example of the signal transmission circuit using conventional CMOS inverters.
Figure 12:
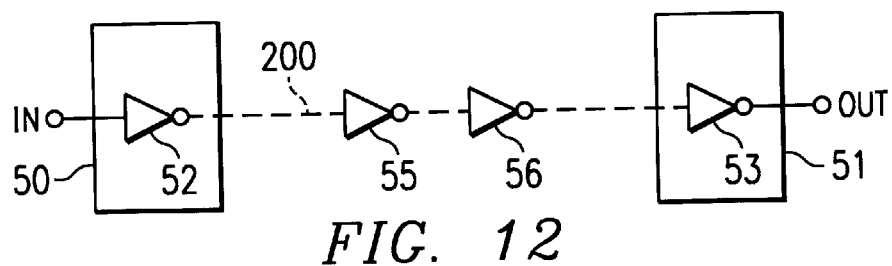
FIG. 12 is a circuit diagram illustrating an example of the signal transmission circuit using conventional CMOS inverters.
Figure 13:
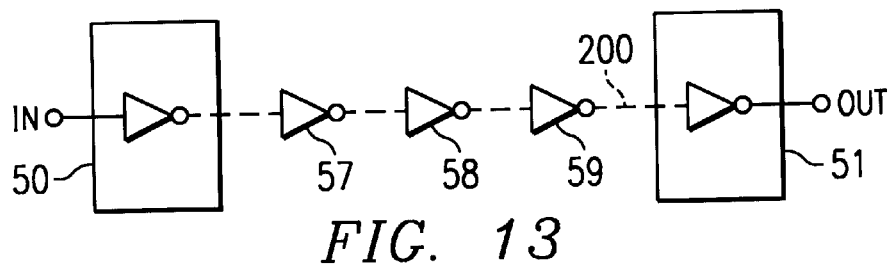
FIG. 13 is a circuit diagram illustrating an example of the signal transmission circuit using conventional CMOS inverters.

FIG. 9 is a graph illustrating the relationship between the wiring length and the delay for the simulation circuit configurations shown in FIGS. 4–7.

In FIG. 9, the ordinate represents the delay (nsec), and the abscissa represents the wiring length (×1000 μ).

In FIG. 9, curve ON shows the relation between the wiring length and the delay (nsec) of the signal transmission circuit for the circuit configuration of FIG. 4 with no intermediate amplifier circuit. Curve 2N shows the relation between the wiring length and the delay (nsec) of the signal transmission circuit for the circuit configuration of FIG. 5 with one stage of the intermediate amplifier circuit 1 set in place. Curve 3N shows the relation between the wiring length and the delay (nsec) of the signal transmission circuit for the circuit configuration of FIG. 6 with two stages of the intermediate amplifier circuit 1 set in place. Curve 4N shows the relation between the wiring length and the delay (nsec) of the signal transmission circuit for the circuit configuration of FIG. 7 with three stages of the intermediate amplifier circuit 1 set in place.

Figure 15:
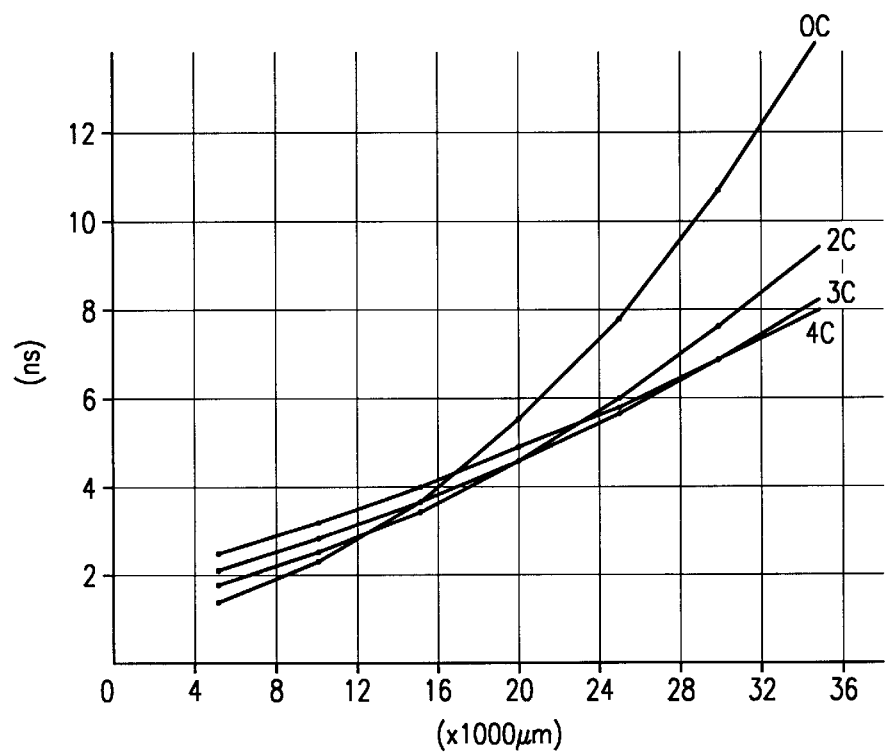
FIG. 15 is a graph showing the relationship between the wiring length and delay of the signal transmission circuit corresponding to the inverter connection configurations of FIGS. 10–13 using the conventional CMOS inverters.
Figure 16:
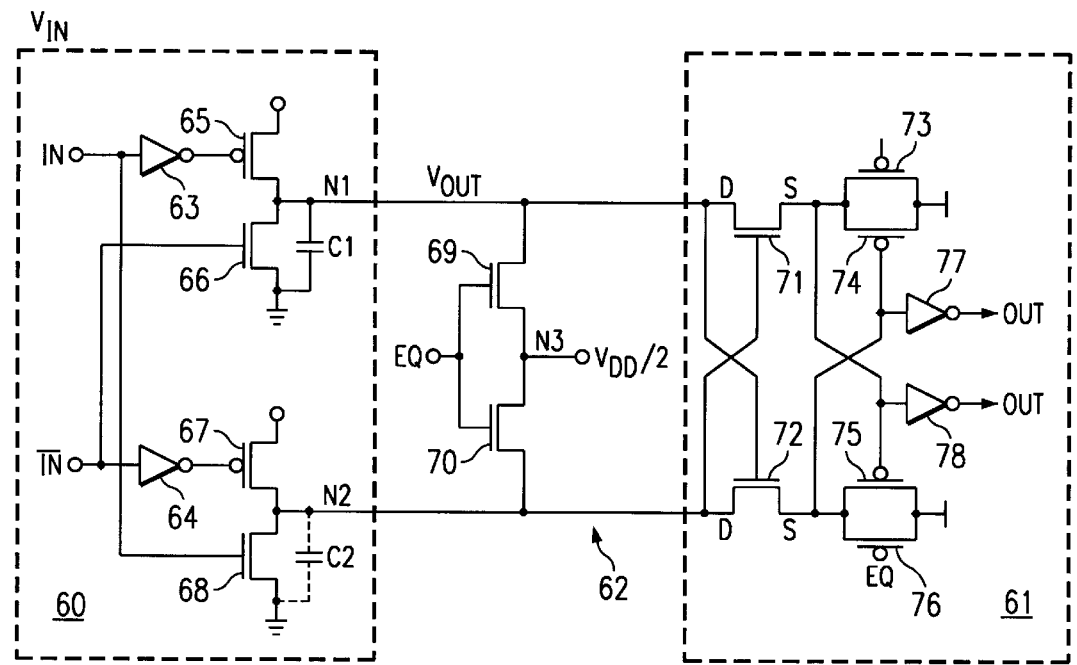
FIG. 16 is a circuit diagram of a conventional signal transmission circuit using the differential signal.
Figure 17:
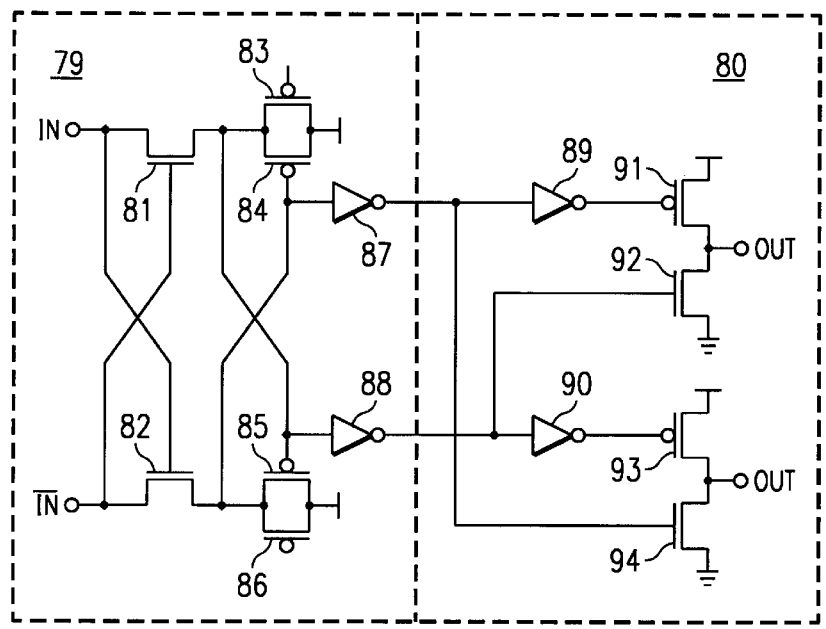
FIG. 17 is a circuit diagram of an intermediate amplifier circuit used in the conventional signal transmission circuit using the differential signal such as shown in FIG. 16.

As the results shown in FIG. 9 are compared with the results shown in FIG. 15, which show the relationship between delay (nsec) and wiring length (×1000 μm) in the signal transmission circuit with the conventional CMOS inverters connected in series in the circuit configurations of FIGS. 10–13, it can be seen that when the wiring length is 20 (×1000 µm) cm, for curve 2N with one stage of the intermediate amplifier circuit 1 set in place as shown in FIG. 9, the delay is about 4.5 nsec (as compared with 5 nsec for the conventional curve 2C as shown in FIG. 15), that is, there is a reduction of about 0.5 nsec in the delay (nsec) of the signal transmission circuit.

For curve 3N for the configuration with two stages of the intermediate amplifier circuit 1 connected in place, the delay is about 4.3 nsec (as compared with 4.8 nsec for the conventional curve 3C as shown in FIG. 15), that is, there is a reduction of about 0.5 nsec in the delay (nsec) of the signal transmission circuit.

For curve 4N for the configuration with three stages of the intermediate amplifier circuit 1 connected in place, the delay is about 4.3 nsec (as compared with 4.8 nsec for the conventional curve 4C as shown in FIG. 15), that is, there is a reduction of about 0.5 nsec in the delay (nsec) of the signal transmission circuit.

Consequently, compared with the signal transmission circuit using conventional CMOS inverters connected in series, the signal transmission circuit of the invention can reduce the delay (nsec) of the signal transmission circuit by about 0.5 nsec.

In the aforementioned embodiments of the signal transmission circuit of the invention, by means of the positive feedback of the intermediate amplifier circuit equipped with input/output shared terminals, the signal is amplified and transmitted at a high speed and with a low power consumption. This signal transmission circuit can be adopted in the large scale integration (LSI) of various CMOS structures.

In this embodiment, since the clock signal generating circuit for gate control and the gate control circuit may not be used in the intermediate amplifier circuit, the circuit configuration can be set up in a simpler form.

However, it will be understood that the invention in a signal transmission circuit may also be adopted in devices other than the LSI of various CMOS structures.

In accordance with this invention, by means of the positive feedback of the intermediate amplifier circuit equipped with input/output shared terminals, the signal is amplified and transmitted at a high speed and with a low power consumption.

Consequently, this scheme can be used in LSI of various CMOS structures which can transmit signals at a high speed with a low power consumption.

I claim:

1. A signal transmission circuit comprising:
    a driver circuit coupled to receive an input data signal and to receive an enable signal, the enable signal having a first logic state for enabling production of the differential output data signal, the enable signal having a second logic state for disabling the driver circuit, thereby producing a high impedance at the pair of output terminals, the driver circuit producing a differential output data signal at a pair of output terminals;
    a transmission line having two conductors said two conductors being complementary input and output data lines, a first end of each conductor coupled to a respective output terminal of the pair of output terminals;
    a receiver circuit having two input terminals, each input terminal coupled to a respective second end of each conductor, the receiver circuit amplifying the differential output data signal to generate an amplified differential output data signal the receiver circuit further comprising a first transistor and a second transistor, each transistor having a drain terminal coupled to a respective conductor, the first transistor having a gate terminal coupled to the drain terminal of the second transistor, the second transistor having a gate terminal coupled to the drain terminal of the first transistor, each of the first and second transistors having a source terminal coupled to a common terminal; and
    an intermediate amplifier circuit having a pair of data terminals, each data terminal coupled to a respective conductor intermediate the first end and the second end, the intermediate amplifier receiving said differential output data signal at said pair of data terminals, amplifying the differential output data signal in response to a magnitude of the differential output data signal and providing said amplified differential output data signal to said transmission line via said pair of data terminals.

2. A signal transmission circuit as in claim 1, further comprising an equalizer circuit, the equalizer circuit coupling each of the conductors to a voltage terminal in response to a first precharge signal at a time when the enable signal is in the second logic state.

3. A signal transmission circuit as in claim 2, wherein the intermediate amplifier circuit further comprises a data latch circuit coupled to the pair of data terminals and a precharge circuit, the precharge circuit responsive to a second precharge signal for precharging the data latch circuit.

4. A signal transmission circuit as in claim 3, wherein the intermediate amplifier circuit further comprises a pair of output circuits, each output circuit coupled between the data latch circuit and a respective data terminal.

5. A signal transmission circuit as in claim 4, wherein the data latch circuit further comprises a pair of cross-coupled N-channel transistors and a pair of cross-coupled P-channel transistors, one of the pair of cross-coupled N-channel transistors conducting to apply a low logic level to one data terminal, one of the pair of cross-coupled P-channel transistors conducting to apply a logic high level to another data terminal, the N-channel and P-channel transistors being activated in response to a difference voltage at the data terminals.

6. A signal transmission circuit of claim 1 wherein said intermediate amplifier circuit is connected directly to a power source.

7. A signal transmission circuit comprising:
    a driver circuit coupled to receive an input data signal, and to receive an enable signal, the enable signal having a first logic state for enabling production of the differential output data signal, the enable signal having a second logic state for disabling the driver circuit, thereby producing a high impedance at the pair of output terminals, the driver circuit producing a differential output data signal at a pair of output terminals;
    a transmission line having two conductors, said two conductors being complementary input and output data lines, a first end of each conductor coupled to a respective output terminal of the pair of output terminals;
    a receiver circuit having two input terminals, each input terminal coupled to a respective second end of each conductor, the receiver circuit amplifying the differential output data signal to generate an amplified differential output data signal comprising a first transistor and a second transistor, each transistor having a drain terminal coupled to a respective conductor, the first transistor having a gate terminal coupled to the drain terminal of the second transistor, the second transistor having a gate terminal coupled to the drain terminal of the first transistor, each of the first and second transistors having a source terminal coupled to a common terminal; and a plurality of intermediate amplifier circuits, each intermediate amplifier circuit having a pair of data terminals, each data terminal coupled to a respective conductor intermediate the first end and second end, a first intermediate amplifier receiving said differential output data signal at said pair of data terminals, amplifying the differential output data signal in response to a magnitude of the differential output data signal;

and providing an amplified differential output data signal to said transmission line via said pair of data terminals, a second intermediate amplifier receiving said amplified differential output data signal at said pair of data terminals, amplifying the amplified differential output data signal and providing a twice amplified differential output data signal to said transmission line via said pair of data terminals.

8. A signal transmission circuit as in claim 7, further comprising an equalizer circuit, the equalizer circuit coupling each of the conductors to a voltage terminal in response to a first precharge signal at a time when the enable signal is in the second logic state.

9. A signal transmission circuit as in claim 8, wherein the intermediate amplifier circuit further comprises a data latch circuit coupled to the pair of data terminals and a precharge circuit, the precharge circuit responsive to a second precharge signal for precharging the data latch circuit.

10. A signal transmission circuit as in claim 9, wherein the intermediate amplifier circuit further comprises a pair of output circuits, each output circuit coupled between the data latch circuit and a respective data terminal.

11. A signal transmission circuit as in claim 10, wherein the data latch circuit further comprises a pair of cross-coupled N-channel transistors and a pair of cross-coupled P-channel transistors, one of the pair of cross-coupled N-channel transistors conducting to apply a low logic level to one data terminal, one of the pair of cross-coupled P-channel transistors conducting to apply a logic high level to another data terminal, the N-channel and P-channel transistors activated in response to a difference voltage at the data terminals.

12. A signal transmission circuit as in claim 10, wherein the plurality of intermediate amplifier circuits comprises three intermediate amplifier circuits.

13. A signal transmission circuit of claim 7 wherein said intermediate amplifier circuit is connected directly to a power source.

* * * * *